(12) United States Patent
Nagasawa (10) Patent No.: US 10,084,432 B1
(45) Date of Patent: Sep. 25, 2018

(54) SEMICONDUCTOR DEVICE (71) Applicant: Kabushiki Kaisha Toshiba, Minato-ku, Tokyo (JP)

(72) Inventor: Hironori Nagasawa, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/700,470

(22) Filed: Sep. 11, 2017

(30) Foreign Application Priority Data

Mar. 23, 2017 (JP) ................................. 2017-058094

(51) Int. Cl.
*H03H 11/26* (2006.01)
*H01L 27/105* (2006.01)
*H01L 29/08* (2006.01)

(52) U.S. Cl.
CPC ........... *H03H 11/26* (2013.01); *H01L 27/105* (2013.01); *H01L 29/0847* (2013.01)

(58) Field of Classification Search
None
See application file for complete search history.

(56) References Cited

U.S. PATENT DOCUMENTS

| 6,163,199 | A | * | 12/2000 | Miske | H03K 17/162 326/113 |
| 6,359,496 | B1 | * | 3/2002 | Steinhagen | H03K 17/063 327/384 |
| 6,798,255 | B2 | | 9/2004 | Takahashi et al. | |
| 6,855,985 | B2 | | 2/2005 | Williams et al. | |
| 9,621,158 | B2 | * | 4/2017 | Tung | H03K 17/693 |

FOREIGN PATENT DOCUMENTS

| JP | 2001-007695 A | 1/2001 |
| JP | 2002-353312 A | 12/2002 |
| JP | 2014-013909 A | 1/2014 |

* cited by examiner

*Primary Examiner* — Jeffrey Zweizig
(74) *Attorney, Agent, or Firm* — White & Case LLP (57) ABSTRACT

A semiconductor device according to an embodiment includes; an N-channel type first MOS transistor having a first drain connected to an input terminal, a first source connected to an output terminal, a first gate insulation film, and a first gate; a P-channel type second MOS transistor having a second drain connected to the input terminal in parallel with the first drain, a second source connected to the output terminal in parallel with the first source, a second gate insulation film whose area is larger than an area of the first gate insulation film, and a second gate; an inverter connected to a control terminal in parallel with the first gate; and a delay circuit disposed between the inverter and second gate.

10 Claims, 6 Drawing Sheets

SEMICONDUCTOR DEVICE

CROSS-REFERENCE TO RELATED APPLICATIONS

This application is based upon and claims the benefit of priority from Japanese Patent Application No. 2017-058094, filed on Mar. 23, 2017; the entire contents of which are incorporated herein by reference.

FIELD

An embodiment of the present invention relates to a semiconductor device.

BACKGROUND

There is a switching circuit, in which an N-channel type metal oxide semiconductor (MOS) and a P-channel type MOS transistor are connected in parallel with each other between an input terminal and an output terminal and these MOS transistors are simultaneously turned on and off. In the above-mentioned switching circuit, so-called crosstalk, in which a signal leaks from a gate terminal to a drain terminal and a source terminal, may occur. In this case, if the crosstalk timing of one MOS transistor approaches the crosstalk timing of the other MOS transistor, the crosstalk will be mutually cancelled.

However, in the above-mentioned switching circuit, in order to suppress a difference in ON resistance between both types of MOS transistors, the area of a gate insulation film of the P-channel type MOS transistor is designed to be greater than the area of a gate insulation film of the N-channel type MOS transistor. Therefore, suppressing the crosstalk is difficult.

An embodiment of the present invention provides a semiconductor device capable of suppressing the crosstalk, while suppressing the difference in ON resistance between the MOS transistors that are simultaneously driven.

DETAILED DESCRIPTION

Embodiments will now be explained with reference to the accompanying drawings. The present invention is not limited to the embodiments.

First Embodiment

Figure 1:
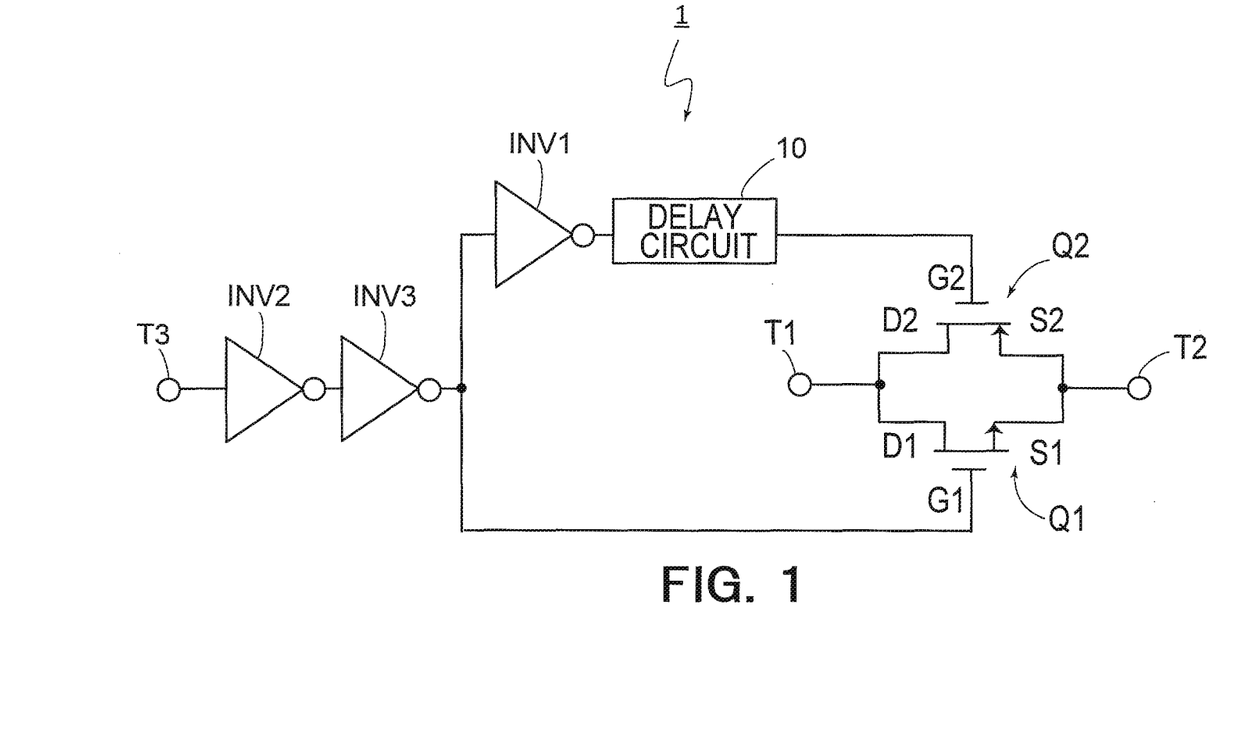
FIG. 1 is a circuit diagram showing a configuration of a semiconductor device according to a first embodiment.

FIG. 1 is a circuit diagram showing a configuration of a semiconductor device according to a first embodiment. A semiconductor device 1 shown in FIG. 1 includes an N-channel type MOS transistor Q1 (a first MOS transistor) and a P-channel type MOS transistor Q2 (a second MOS transistor), a plurality of inverters INV1 to INV3, and a delay circuit 10.

Figure 2A:
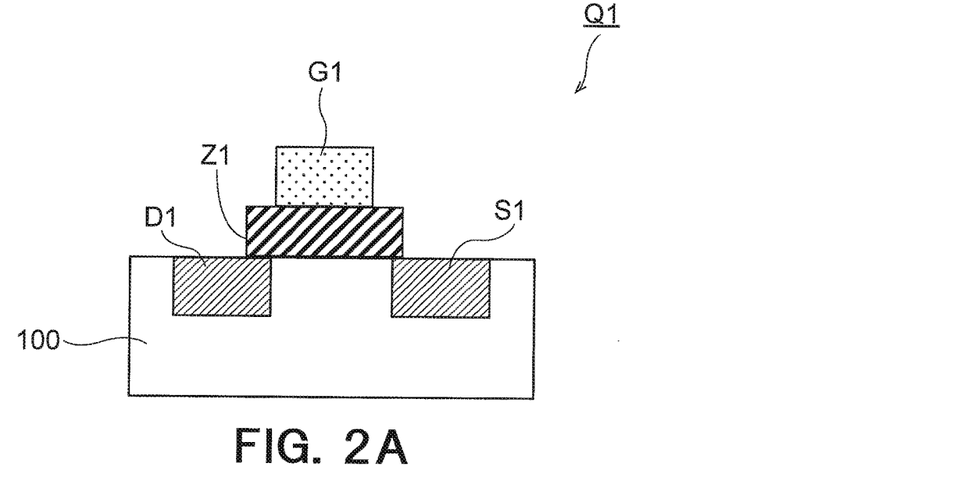
FIG. 2A shows a cross-sectional structure of a MOS transistor Q1.

FIG. 2A shows a cross-sectional structure of the MOS transistor Q1. The MOS transistor Q1 includes a drain D1 (a first drain), a source S1 (a first source), a gate insulation film Z1 (a first gate insulation film), and a gate G1 (first gate). The conductivity types of the drain D1 and the source S1 are N type, and both the drain D1 and the source S1 are provided, for example, on a P-type silicon substrate 100. Further, the drain D1 is connected to an input terminal T1 and the source S1 is connected to an output terminal T2 (refer to FIG. 1). The gate insulation film Z1 is, for example, a silicon oxide ($SiO_2$) film. The gate G1 is insulated from the drain D1 and the source S1 via the gate insulation film Z1. The switching element Q1 is a bidirectional switch through which current can flow between the drain D1 and the source S1 in both directions.

Figure 2B:
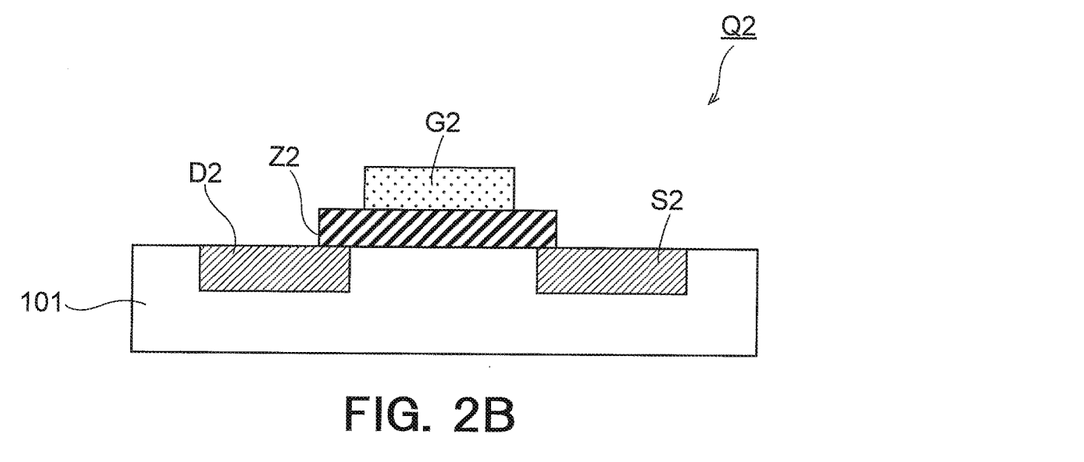
FIG. 2B shows a cross-sectional structure of a MOS transistor Q2.

FIG. 2B shows a cross-sectional structure of the MOS transistor Q2. The MOS transistor Q2 includes a drain D2 (a second drain), a source S2 (a second source), a gate insulation film Z2 (a second gate insulation film), and a gate G2 (a second gate). The conductivity types of the drain D2 and the source S2 are P type, and both the drain D2 and the source S2 are provided, for example, on an N-type silicon substrate 101. Further, the drain D2 is connected to the input terminal T1 in parallel with the drain D1. On the other hand, the source S2 is connected to the output terminal T2 in parallel with the source S1 (refer to FIG. 1). The switching element Q2 is a bidirectional switch through which current can flow between the drain D2 and the source S2 in both directions.

The gate insulation film Z2 is a silicon oxide film similar to the gate insulation film Z1. Further, the area of the gate insulation film Z2 is larger than the area of the gate insulation film Z1. In other words, the area mentioned above is a channel area formed just beneath the gate insulation film Z1 and the gate insulation film Z2 when a voltage is applied to each of the gate G and the gate G2. The gate G2 is insulated from the drain D2 and the source S2 via the gate insulation film Z2.

Referring back to FIG. 1, the inverter INV1 has an input terminal connected to a control terminal T3 via the inverters INV2 and INV3. The inverter INV1 has an output terminal connected to the gate G2 via the delay circuit 10. The inverter INV2 and the inverter INV3 are serially connected to the control terminal T3. A control signal for simultaneously turning on and off the MOS transistor Q1 and the MOS transistor Q2 is input to the control terminal T3.

The inverter INV2 inverts the control signal. The inverter INV3 inverts an output signal of the inverter INV2. As a result, the control signal can be shaped. When the shaping of the control signal is unnecessary, the semiconductor device 1 is not required to include both the inverter INV2 and the inverter INV3. The shaped control signal is inverted by the inverter INV1 and input to the gate G2 via the delay circuit 10. The shaped control signal is also directly input to the gate G1.

Figure 3:
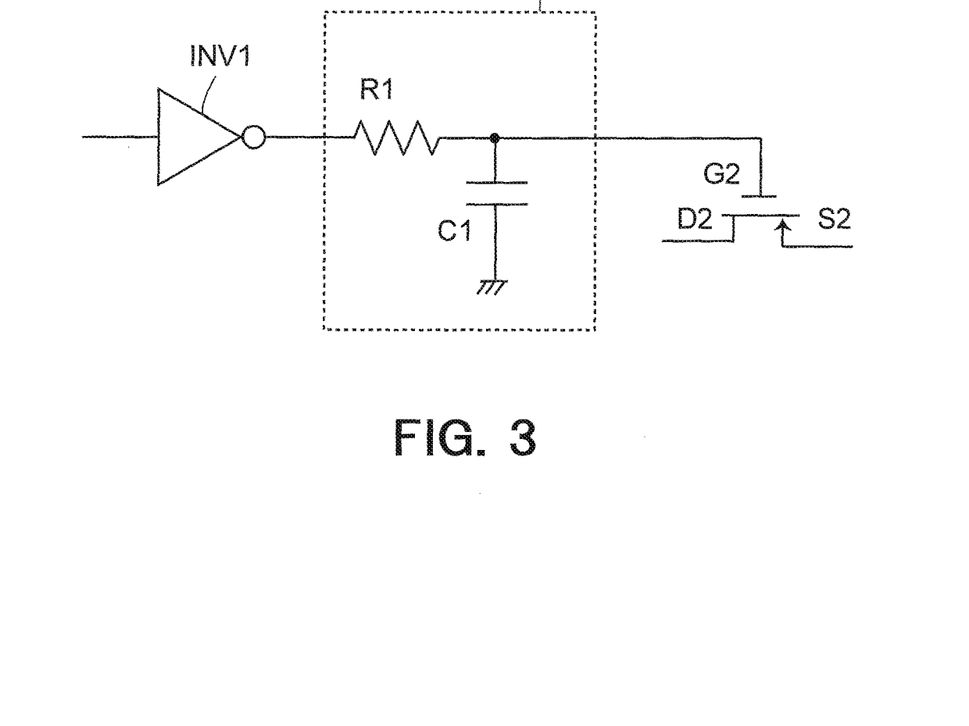
FIG. 3 is a circuit diagram showing a configuration of a delay circuit.

FIG. 3 is a circuit diagram showing a configuration of the delay circuit 10. The delay circuit 10 shown in FIG. 3 includes a resistance element R1 and a capacitor C1. The resistance element R1 is disposed between the inverter INV1 and the gate G2. The capacitor C1 has one end connected to the resistance element R1 on the gate G2 side and the other end being grounded.

Hereinafter, an operation of the semiconductor device 1 according to the present embodiment will be described. If the crosstalk is taken into consideration for the MOS transistor Q1 and the MOS transistor Q2, an equivalent circuit of a current path from the gate to the drain or the source via the gate insulation film is modeled as a high-pass filter shown in FIG. 4.

Figure 4:
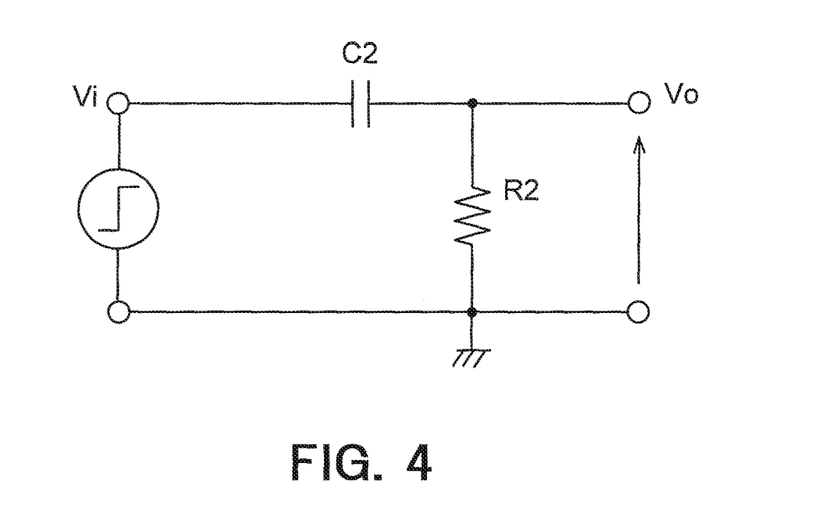
FIG. 4 is a high-pass filter modeling the MOS transistor Q1 or the MOS transistor Q2.

A signal expressed by the following expression (1) is input to the high-pass filter shown in FIG. 4. The input signal corresponds to the control signal input to the control terminal T3 shown in FIG. 1. In the expression (1), potential difference E is an electric potential difference between a high level and a low level of the above-mentioned control signal and time constant α is a time constant of the control signal.

$$Vi = E\left(1 - e^{\frac{-t}{\alpha}}\right) \quad (1)$$

Figure 5A:
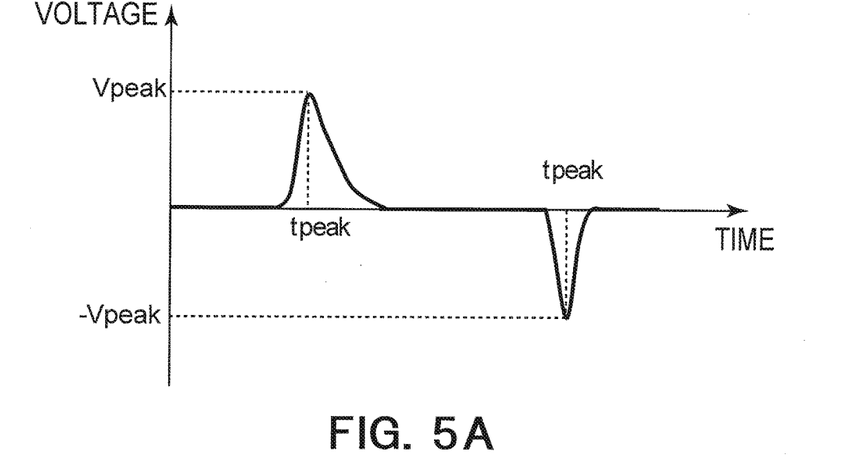
FIG. 5A shows a voltage waveform of the MOS transistor Q1.
Figure 5B:
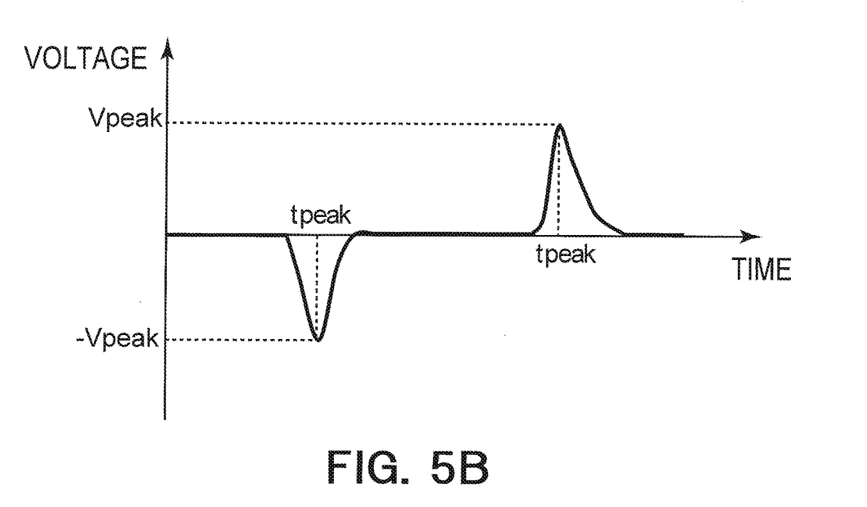
FIG. 5B shows a voltage waveform of the MOS transistor Q2.

When the above-mentioned control signal is input to the high-pass filter modeling the MOS transistor Q1, the high-pass filter generates an output voltage Vo having a voltage waveform, for example, as shown in FIG. 5A. On the other hand, when the above-mentioned control signal is input to the high-pass filter modeling the MOS transistor Q2, the high-pass filter generates an output voltage Vo having a voltage waveform, for example, shown in FIG. 5B.

The above-mentioned output voltage Vo can be expressed by the following expression (2). In other words, the output voltage Vo is a crosstalk voltage.

$$Vo = \frac{ECR}{CR - \alpha} \times \left(e^{\frac{-t}{CR}} - e^{\frac{-t}{\alpha}}\right) \quad (2)$$

The following expression (3) can be obtained by differentiating the above-mentioned expression (2) with time t. In the expression (3), capacitance value C is a capacitance value of a capacitor C2 shown in FIG. 4. The capacitance value C corresponds to a capacitance value Cn of the gate insulation film Z1 of the MOS transistor Q1 or a capacitance value Cp of the gate insulation film Z2 of the MOS transistor Q2. Resistance value R is a resistance value of a resistance element R2 shown in FIG. 4.

$$\frac{dVo}{dt} = \frac{ECR}{CR - \alpha} \times \left(-\frac{1}{CR}e^{\frac{-t}{CR}} + \frac{1}{\alpha}e^{\frac{-t}{\alpha}}\right) \quad (3)$$

According to the expression (3), the crosstalk voltage takes a peak value Vpeak at time tpeak at which dVo/dt=0. The time tpeak can be expressed by the following expression (4).

$$tpeak = \frac{\alpha CR}{CR - \alpha} \times \ln\left(\frac{CR}{\alpha}\right) \quad (4)$$

The peak value Vpeak of the crosstalk voltage can be expressed by the following expression (5) where the expression (4) is substituted into the expression (2).

$$Vpeak = \frac{ECR}{CR - \alpha} \times \left\{\left(\frac{CR}{\alpha}\right)^{\frac{-\alpha}{CR-\alpha}} - \left(\frac{CR}{\alpha}\right)^{\frac{-CR}{CR-\alpha}}\right\} \quad (5)$$

In the expression (5), when the time constant α is a time constant of the control signal input to the gate G1 of the MOS transistor Q1, time constant β of the control signal input to the gate G2 of the MOS transistor Q2 is set to be a value obtainable by multiplying a constant k (k>1) by the time constant α. The time constant β corresponds to a time constant of the delay circuit 10. Further, the constant k=Cp/Cn, namely, the constant k is a ratio of the capacitance of the gate insulation film Z2 to the capacitance of the gate insulation film Z1. The constant k can be converted into a ratio of the size of the gate insulation film Z2 to the size of the gate insulation film Z1.

According to the expression (5), the time constant β is set so that β=kα. Therefore, the peak value Vpeak of the crosstalk of the MOS transistor Q1 coincides with that of the MOS transistor Q2. This means that mutually cancelling the crosstalk of the MOS transistor Q1 and that of the MOS transistor Q2 can be realized.

In the present embodiment described above, the delay circuit 10 is disposed between the gate G2 of the second MOS transistor Q2 and the inverter INV1. The timing at which the crosstalk of the second MOS transistor Q2 reaches the peak value can be brought close to the timing at which the crosstalk of the first MOS transistor Q1 reaches the peak value, by adjusting the time constant of the delay circuit 10.

Accordingly, suppressing the crosstalk is feasible even when the area of the gate insulation film is different between the MOS transistor Q1 and the MOS transistor Q2 in order to suppress the difference in ON resistance. In particular, in the present embodiment, the time constant of the delay circuit 10 is set to be a value obtainable by multiplying the time constant of the control signal input to the control terminal T3 by the ratio of the area of the gate insulation film Z2 to the area of the gate insulation film Z1. In this case, the crosstalk can be surely avoided because the crosstalk peak values of the MOS transistor Q1 and that of the MOS transistor Q2 cancel out each other.

Figure 6:
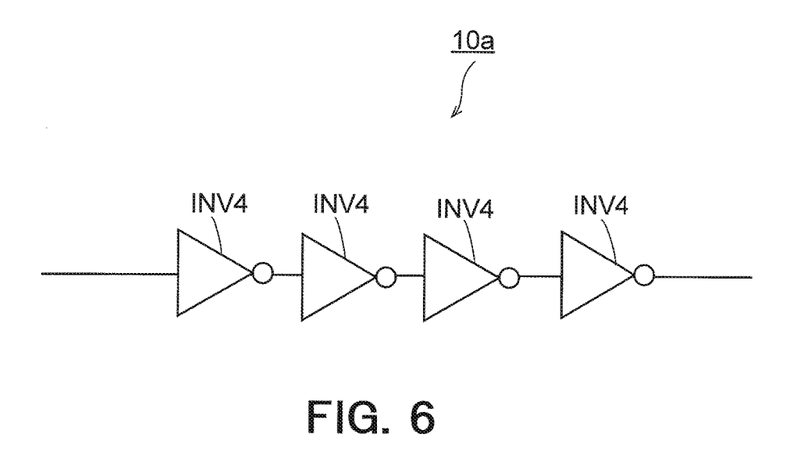
FIG. 6 is a circuit diagram showing another configuration of the delay circuit.

In the present embodiment, the delay circuit 10 includes the resistance element R1 and the capacitor C1, as shown in FIG. 3. However, for example, the delay circuit 10 can be replaced by a delay circuit 10a shown in FIG. 6. The delay circuit 10a includes an even number of inverters INV4 that are connected serially to each other. It is desired that time constant γ of the delay circuit 10a be set to be equal to the time constant β of the delay circuit 10, namely it is desired that γ=kα. In this case, surely avoiding the crosstalk is feasible because the peak value Vpeak of the crosstalk of the MOS transistor Q1 coincides with that of the MOS transistor Q2.

Second Embodiment

Figure 7:
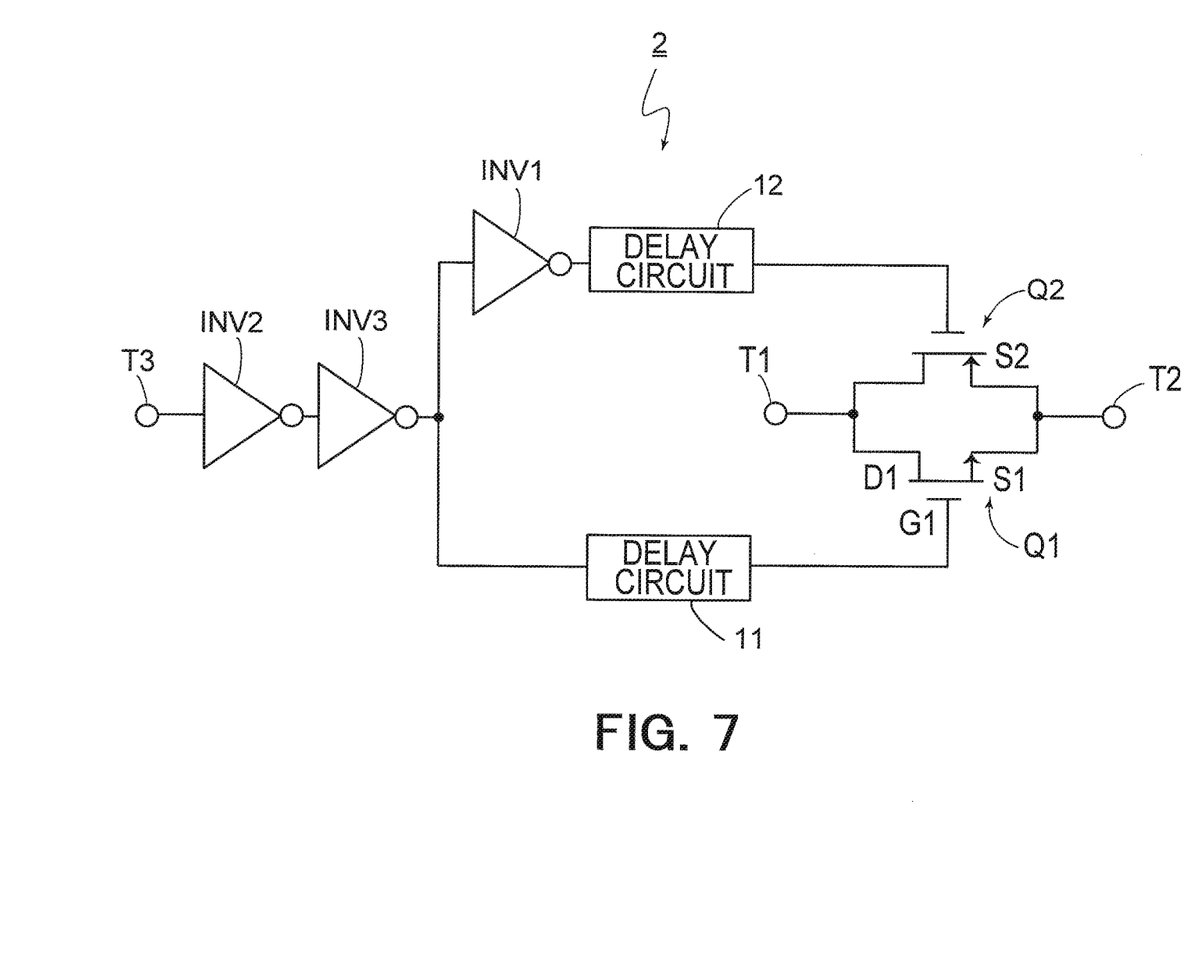
FIG. 7 is a circuit diagram showing a configuration of a semiconductor device according to a second embodiment.

FIG. 7 is a circuit diagram showing a configuration of a semiconductor device according to a second embodiment. In FIG. 7, constituent components similar to those already described in the first embodiment are denoted by the same reference numerals and a detailed description thereof will be omitted.

A semiconductor device 2 according to the present embodiment is different from the semiconductor device 1 according to the first embodiment in that a delay circuit 11

(a first delay circuit) and a delay circuit 12 (a second delay circuit) are provided. In circuit configuration, the delay circuit 11 and the delay circuit 12 are similar to the delay circuit 10 shown in FIG. 3, or the delay circuit 10a shown in FIG. 6. Although it is desired that the delay circuit 11 be identical or similar to the delay circuit 12 in circuit configuration, the delay circuit 11 and the delay circuit 12 can be configured differently. For example, when the delay circuit 11 is an RC circuit constituted by the resistance element R1 and the capacitor C1 shown in FIG. 3, it is desired that the circuit configuration of the delay circuit 12 be similarly an RC circuit.

The delay circuit 11 is disposed between the gate G1 of the MOS transistor Q1 and the control terminal T3. On the other hand, the delay circuit 12 is disposed between the gate G2 of the MOS transistor Q2 and the inverter INV1.

Time constant β of the delay circuit 12 is greater than time constant α of the delay circuit 11. In particular, when time constant ratio β/α is equal to ratio Cp/Cn of the capacitance of the gate insulation film Z2 to the capacitance of the gate insulation film Z1, in other words, when the time constant ratio β/α is equal to the ratio of the area of the gate insulation film Z2 to the area of the gate insulation film Z1, the above-mentioned expression (5) shows that the peak value Vpeak of the crosstalk of the MOS transistor Q1 coincides with that of the MOS transistor Q2.

Accordingly, even in the present embodiment, it is feasible to surely avoid the crosstalk while suppressing the difference in ON resistance between the MOS transistor Q1 and the MOS transistor Q2.

Further, in the present embodiment, one delay circuit 12 is provided on the MOS transistor Q2 side and the other delay circuit 11 is provided on the MOS transistor Q1 side. Therefore, the crosstalk peak value of the MOS transistor Q1 and that of the MOS transistor Q2 can cancel out each other easily by adjusting the resistance value of the resistance element R1 and the capacitance value of the capacitor C1, when each of the delay circuit 11 and the delay circuit 12 includes the resistance element R1 and the capacitor C1.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor device comprising;
an N-channel type first MOS transistor having a first drain connected to an input terminal, a first source connected to an output terminal, a first gate insulation film, and a first gate insulated from the first drain and the first source via the first gate insulation film;
a P-channel type second MOS transistor having a second drain connected to the input terminal in parallel with the first drain, a second source connected to the output terminal in parallel with the first source, a second gate insulation film whose area is larger than that of the first gate insulation film, and a second gate insulated from the second drain and the second source via the second gate insulation film;
an inverter having an input terminal connected to a control terminal and an output terminal connected to the second gate; and
a delay circuit disposed between the inverter and the second gate.

2. The semiconductor device according to claim 1, wherein
the delay circuit includes
a resistance element disposed between the inverter and the second gate, and
a capacitor having one end connected to the resistance element on a side of the second gate and the other end being grounded.

3. The semiconductor device according to claim 1, wherein
the delay circuit includes an even number of inverters connected serially to each other.

4. The semiconductor device according to claim 1, wherein
a time constant of the delay circuit is a value obtainable by multiplying a time constant of a control signal input to the control terminal by a ratio of an area of the second gate insulation film to an area of the first gate insulation film.

5. A semiconductor device comprising:
an N-channel type first MOS transistor having a first drain connected to an input terminal, a first source connected to an output terminal, a first gate insulation film, and a first gate insulated from the first drain and the first source via the first gate insulation film;
a P-channel type second MOS transistor having a second drain connected to the input terminal in parallel with the first drain, a second source connected to the output terminal in parallel with the first source, a second gate insulation film whose area is larger than an area of the first gate insulation film, and a second gate insulated from the second drain and the second source via the second gate insulation film;
an inverter having an input terminal connected to a control terminal and an output terminal connected to the second gate;
a first delay circuit disposed between the control terminal and the first gate; and
a second delay circuit disposed between the inverter and the second gate, and having a time constant being set to be greater than a time constant of the first delay circuit.

6. The semiconductor device according to claim 5, wherein
the second delay circuit includes
a resistance element disposed between the inverter and the second gate, and
a capacitor having one end connected to the resistance element on a side of the second gate and the other end being grounded.

7. The semiconductor device according to claim 5, wherein
the first delay circuit includes
a resistance element disposed between the control terminal and the first gate, and
a capacitor having one end connected to the resistance element on a side of the first gate and the other end being grounded.

8. The semiconductor device according to claim 5, wherein
the second delay circuit includes
a resistance element disposed between the inverter and the second gate, and a capacitor having one end connected to the resistance element on a side of the second gate, and the other end being grounded, and the first delay circuit includes another resistance element disposed between the control terminal and the first gate, and another capacitor having one end connected to the another resistance element on a side of the first gate and the other end being grounded.

9. The semiconductor device according to claim 5, wherein at least one of the first delay circuit and the second delay circuit includes even number of inverters connected serially to each other.

10. The semiconductor device according to claim 5, wherein a ratio of a time constant of the first delay circuit to a time constant of the second delay circuit is equal to a ratio of an area of the second gate insulation film to an area of the first gate insulation film.

* * * * *